United States Patent
Buch et al.

(10) Patent No.: US 8,130,553 B2
(45) Date of Patent: Mar. 6, 2012

(54) SYSTEMS AND METHODS FOR LOW WEAR OPERATION OF SOLID STATE MEMORY

(75) Inventors: Bruce D. Buch, Westborough, MA (US);
Ara Patapoutian, Hopkinton, MA (US);
Bengt A. Ulriksson, Milford, MA (US);
Bernardo Rub, Sudbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 310 days.

(21) Appl. No.: 12/629,481

(22) Filed: Dec. 2, 2009

(65) Prior Publication Data

US 2011/0131444 A1    Jun. 2, 2011

(51) Int. Cl.
*G11C 16/04* (2006.01)
*G11C 16/06* (2006.01)

(52) U.S. Cl. .......... 365/185.24; 365/185.03; 365/185.09

(58) Field of Classification Search .............. 365/185.24
See application file for complete search history.

(56) References Cited

U.S. PATENT DOCUMENTS

| | | | |
|---|---|---|---|
| 7,239,557 B2 * | 7/2007 | Ha | 365/185.33 |
| 7,542,350 B2 * | 6/2009 | Park et al. | 365/185.24 |
| 8,068,360 B2 * | 11/2011 | Anholt | 365/185.03 |
| 2007/0047327 A1 * | 3/2007 | Goda et al. | 365/185.29 |
| 2007/0171714 A1 * | 7/2007 | Wu et al. | 365/185.09 |
| 2008/0049512 A1 * | 2/2008 | Seidel et al. | 365/185.22 |
| 2008/0235561 A1 | 9/2008 | Yang | |
| 2010/0027335 A1 * | 2/2010 | Kim et al. | 365/185.09 |

OTHER PUBLICATIONS

F. Sun, K. Rose, and T. Zhang, On the Use of Strong BCH Codes for Improving Multilevel NAND Flash Memory Storage Capacity, IEEE Workshop on Signal Processing Systems (SiPS): Design and Implementation, Oct. 2006.

* cited by examiner

*Primary Examiner* — Son Mai
(74) *Attorney, Agent, or Firm* — David D. Brush; Westman, Champlin & Kelly, P.A.

(57) ABSTRACT

This disclosure is related to systems and methods for low wear operation of solid state memory, such as a flash memory. In one example, a controller is coupled to a memory and adapted to dynamically adjust programming thresholds over the course of usage of the data storage device such that a signal-to-noise ratio from reading data stored in the data storage cells is no less than a minimum amount needed to recover the data using an enhanced error detection capability.

22 Claims, 6 Drawing Sheets

SYSTEMS AND METHODS FOR LOW WEAR OPERATION OF SOLID STATE MEMORY

BACKGROUND

Solid state memory, such as flash memory, may be rendered unusable due to cell degradation, which may be caused by excessive program and erase (P/E) cycles. To help remedy this, wear-leveling algorithms have been implemented to evenly spread the location of the P/E cycles throughout the memory array. However, many solid state memories still suffer from a short usable life due to cell degradation even when they use wear-leveling. Thus, a new system and method of low wear operation is needed.

SUMMARY

In one embodiment, a memory device comprises an array of data storage cells and a control circuit connected to the array of data storage cells. The data storage cells can be electrically programmed and erased by applying a first programming voltage and programming pulse sequence to achieve a first charge transfer and a first threshold voltage having a first signal-to-noise ratio. The control circuit can be adapted to program the data storage cells by applying a second programming voltage and programming pulse sequence to achieve a second charge transfer that is less than the first charge transfer and a second threshold voltage that is less than the first threshold voltage. The second threshold voltage provides a second signal-to-noise ratio that is lower than the first signal-to-noise ratio.

In another embodiment, a method comprises providing a memory having data storage cells, wherein the data storage cells can be electrically programmed and erased by applying a programming voltage and programming sequence to induce a charge transfer that changes a first threshold voltage. When programmed and subsequently read, the data storage cells with the first threshold voltage programmed produce a first signal-to-noise ratio. The method also includes programming and erasing the data storage cells by applying a second programming voltage and programming sequence to achieve a second threshold voltage that is less than the first threshold voltage, which produces a second signal-to-noise ratio that is lower than the first signal-to-noise ratio. The method further includes retrieving data stored in the data storage cells using a second detection capability that is greater than a first detection capability. The second detection capability can be adapted to recover data stored using the second threshold voltage and the first detection capability is not capable of recovering data stored using the second threshold voltage.

In yet another embodiment, a data storage device comprises a memory having a control circuit and electrically programmable and erasable data storage cells. The data storage cells having programming thresholds for programming the data storage cells. The data storage device also comprises a controller coupled to the memory and adapted to dynamically adjust the programming thresholds over the course of usage of the data storage device such that a signal-to-noise ratio from reading data stored in the data storage cells is no less than a minimum amount needed to recover the data using an error detection capability.

DETAILED DESCRIPTION

In the following detailed description of the embodiments, reference is made to the accompanying drawings which form a part hereof, and in which are shown by way of illustration of specific embodiments. It is to be understood that other embodiments may be utilized and structural changes may be made without departing from the scope of the present disclosure.

Figure 1:
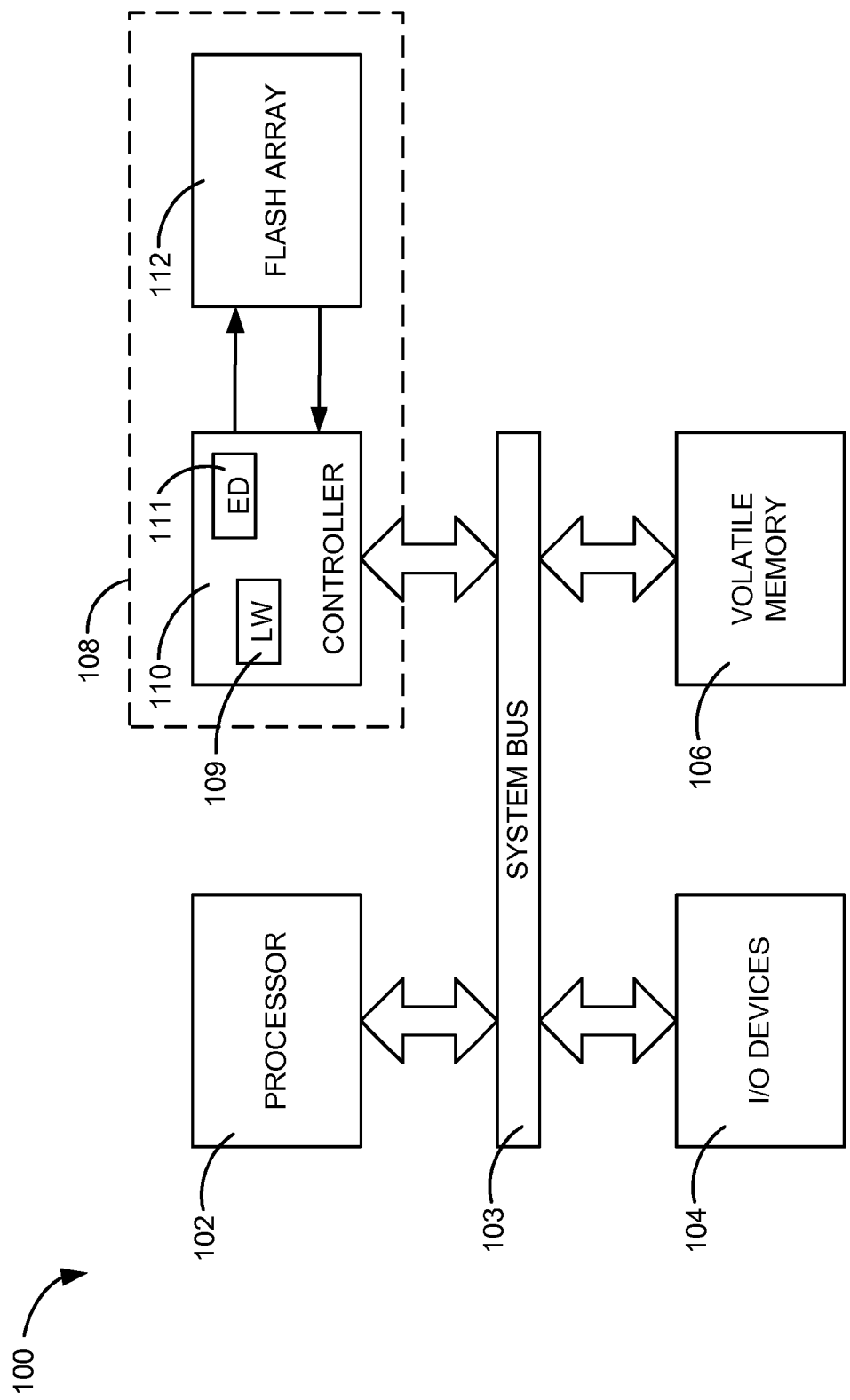
FIG. 1 is a diagram of an illustrative embodiment of a system for low wear operation of a memory device.

Referring to FIG. 1, a particular embodiment of a system of memory management is shown and generally designated 100. The system of memory management 100 may include a processor 102 connected to a system bus 103 which also can be connected to input/output (I/O) devices 104, such as a keyboard, monitor, modem, storage device, or pointing device. The system bus 103 may also be coupled to a memory 106, which may be a random access volatile memory, such as dynamic random access memory (DRAM). The system bus may also be coupled to a data storage device 108. In a particular embodiment, the data storage device 108 comprises a non-volatile flash memory device.

The data storage device 108 may include a controller 110, which may be coupled to the processor 102 via a connection through the system bus 103. The controller 110 may include a low-wear module 109 and enhanced detection module 111. The data storage device 108 may also contain an array of data storage cells 112. The array of data storage cells 112 may include one or more integrated circuit memory chips. For example, the data storage cells 112 may be Multi-Level Cell (MLC) NAND non-volatile memory or Single-Level Cell (SLC) NAND non-volatile memory.

During operation, the processor 102 may send a command and data to the memory device 108 to retrieve or store data. The controller 110 can receive the command and data from the processor 102 and then determine when to store or retrieve data from the array of data storage cells 112.

In a particular embodiment, when a command and data is received from the processor 102 to store or retrieve data, the controller 110 may execute the low wear module 109 or the enhanced detection module 111 to extend the usable life of the data storage cells 112. In a particular embodiment, the controller 110 may execute both the low wear module 109 and the enhanced detection module 111 to farther extend the life of the flash memory array.

The low wear module 109 and enhanced detection module 111 may be implemented as a default setting of the data storage device 108, such that they both are enabled throughout the life of the data storage device 108. Alternatively, the low wear module 109 and the enhanced detection module 111 may be implemented based on a trigger, such as when a certain number of program/erase (P/E) cycles have occurred, an elapsed time period, or a specific signal-to-noise ration (SNR) has been reached. Further, the low wear module 109 and the enhanced detection module 111 may be implemented during a power saving scheme to reduce power consumption.

The low wear mode implemented by the low wear module may also reduce programming and erase times.

Generally, the data storage cells 112 can be electrically programmed and erased by a sequence of voltage pulses applied to the cells which induces a charge transfer to achieve a necessary threshold voltage, which produces a first signal-to-noise ratio, that is above a threshold needed to recover or verify the data without using any enhanced detection techniques. The threshold voltage is the voltage at which a cell begins to conduct when that voltage is applied to the cell's control gate. This threshold is modified by charge stored on a floating gate or charge-trapping layer in the cell, said charge transferred to or from the floating gate or trapping layer by current generated during program and erase operations.

In a particular embodiment, the low wear module 109 can set the threshold voltages lower for the data storage cells 112 such that they would produce a signal-to-noise ratio that is lower than the first signal-to-noise ratio threshold. The low wear module 109 may achieve lower threshold voltages by reducing the charge transfer applied to the data storage cells 112. The lower threshold voltages can be set closer together than what is generally required for feasible read recovery of the data if the enhanced detection module 111 is not used. In addition, the low wear module 109 may lower the charge transfer by reducing programming voltage, programming pulse widths, number of programming current pulses, and erase current time.

In another particular embodiment, the threshold voltages may be set by modifying one or more register settings in the array of data storage cells 112. These registers may include: a register to store an indicator of an amount of voltage to apply to the data storages cells, a register to store a value indicative of a programming current pulse width, a register to store a value indicative of an erase current time, a register to store a value indicative of a number of programming current pulses to be applied, and registers that store the threshold voltages targeted by programming and erase operations. The controller 110 can be configured to modify the values stored in the registers to achieve a lower charge transfer and a lower threshold voltage. One or more of the register settings may be modified to achieve the lower charge transfer and lower threshold voltage.

The threshold voltages may be set dynamically as the data storage device 108 is in use or prior to shipment of the data storage device 108 to an end user. Further, the array of data storage cells 112 may be fabricated separately from the rest of the data storage device 108 and may have the lower threshold voltages stored in the registers upon manufacture.

The enhanced detection module 111 may be configured to read the data stored in the data storage cells using enhanced detection capabilities that are enabled to read data under low SNR conditions, such as channel or coding strategy. For example, the enhanced detection capability can include using strong BCH codes. In another example, the enhanced detection capability may include multi-dimensional error correcting code (ECC) such as one ECC method to correct errors in a single page and a second ECC method to correct errors across multiple pages. In yet another example, the enhanced detection capability may include soft information detector with a low-density parity-check (LDPC) code.

In addition, the controller 110 may be configured to execute the low wear module 109 to dynamically adjust programming thresholds of the array of data storage cells 112 such that an SNR from reading data stored in the data storage cells 112 is within a range of a minimum SNR needed to recover the data using the enhanced detection module 111. In a particular embodiment, the low wear module 109 may be configured to determine a minimum SNR threshold needed to read data while using the enhanced detection capability, set the lower voltage based on the minimum SNR threshold, monitor the SNR, and adjust the threshold voltages when the SNR is lower than the minimum SNR threshold. The error rate may be continually monitored and the program threshold voltages accordingly adjusted to keep the SNR within a relatively small range above the minimum SNR threshold. SNR may be measured based on a distribution of errors, such as the number of errors per read. The minimum SNR may be chosen based on the probability of failure. For example, the minimum SNR may be chosen to predict a probability of only one in a million reads causing a failure when the enhanced detection capability is used to correct errors.

Figure 2:
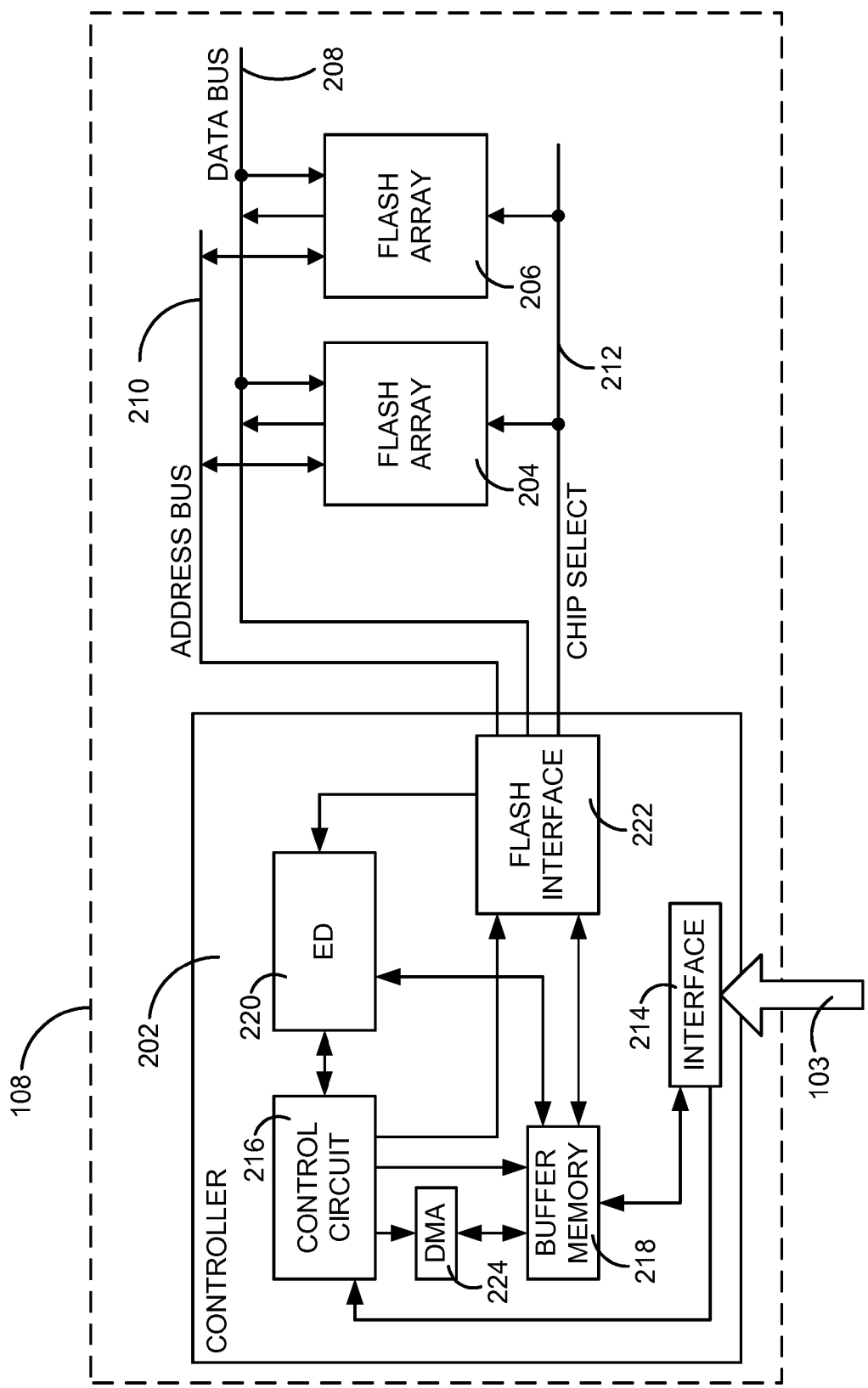
FIG. 2 is a diagram of another illustrative embodiment of a system for low wear operation of a memory device.

Referring to FIG. 2, a particular embodiment of the data storage device 108 is shown. The data storage device 108 may include a controller 202 coupled to a first memory array 204 and a second memory array 206 via a data bus 208, an address bus 210, and a chip select bus 212. Each memory array may be a nonvolatile flash memory array. In some embodiments, the memory arrays may be Multi-Level Cell (MLC) NAND nonvolatile memory or Single-Level Cell (SLC) NAND nonvolatile memory. In another embodiment, more memory arrays may be coupled to the data bus 208, the address bus 210, and the chip select bus 212 than are shown in FIG. 2.

The controller 202 may be coupled to a system bus 103 via an interface 214 that can receive and send commands and data to a host, such as the processor 102 in FIG. 1. The interface 214 may pass the command to control circuit 216 for processing and also store the received data in a buffer memory 218. The buffer memory may provide the received data to a memory interface 222. In a particular embodiment, the memory interface 222 may be a flash memory interface.

The memory interface 222 can receive data from the buffer memory 218 to be written to one of the memory arrays 204 or 206 and receive address bits from the control circuit 216. The memory interface 222 may assert corresponding data and address bits with appropriate timing and format to a selected flash array. Memory interface 222 may also receive previously stored data from any selected sector of memory array 204 or 206.

The control circuit 216 may be adapted to implement a low wear mode and work in conjunction with an enhanced detection circuit 220 to extend the useful life of the memory arrays 204 and 206. The low wear mode may change the settings of the memory arrays 204 and 206 to implement lower threshold voltages for programming the memory cells. The lower threshold voltages can be an amount below what is generally required for feasible read recovery of the data if the enhanced detection circuit 220 is not used. The lower voltage thresholds will produce an SNR that is lower than an SNR that would be produced if higher voltage thresholds were applied.

The enhanced detection circuit 220 may be configured to read the data stored in the data storage cells of memory arrays 204 and 206 using the enhanced detection capabilities that are enabled to read data under low SNR conditions. In addition, lower thresholds for reading and program verification may be needed, as well as reduced programming current pulse widths, a number of programming current pulses, and erase current time based on the lower voltage thresholds.

In a specific embodiment, the controller 216 may be configured to execute the low wear mode to dynamically adjust programming thresholds of the memory arrays 204 and 206 such that a SNR from reading data stored in the memory arrays 204 and 206 is no greater than a minimum SNR needed to recover the data using the enhanced detection circuit 220. In a particular embodiment, the low wear mode may be configured to determine a minimum SNR threshold needed to read data while using the enhanced detection capability, set the threshold voltages of the memory arrays 204 and 206 based on the minimum SNR threshold, monitor the SNR, and adjust the threshold voltages when the SNR is lower than the minimum SNR threshold. The error rate may be continually monitored and the program threshold voltages accordingly adjusted to keep the SNR within a relatively small range above the minimum SNR threshold. SNR may be measured based on a distribution of errors, such as the number of errors per read. Thus, the lower voltage may be slowly increased over time such that the improved signal margins counteract the increased noise (increased errors per read) of accumulated P/E cycles. In this mode, which may be referred to as a constant SNR mode, the per-cycle wear is changed from a constant to a monotonically increasing function, thus making the accumulated wear roughly quadratic.

Figure 3:
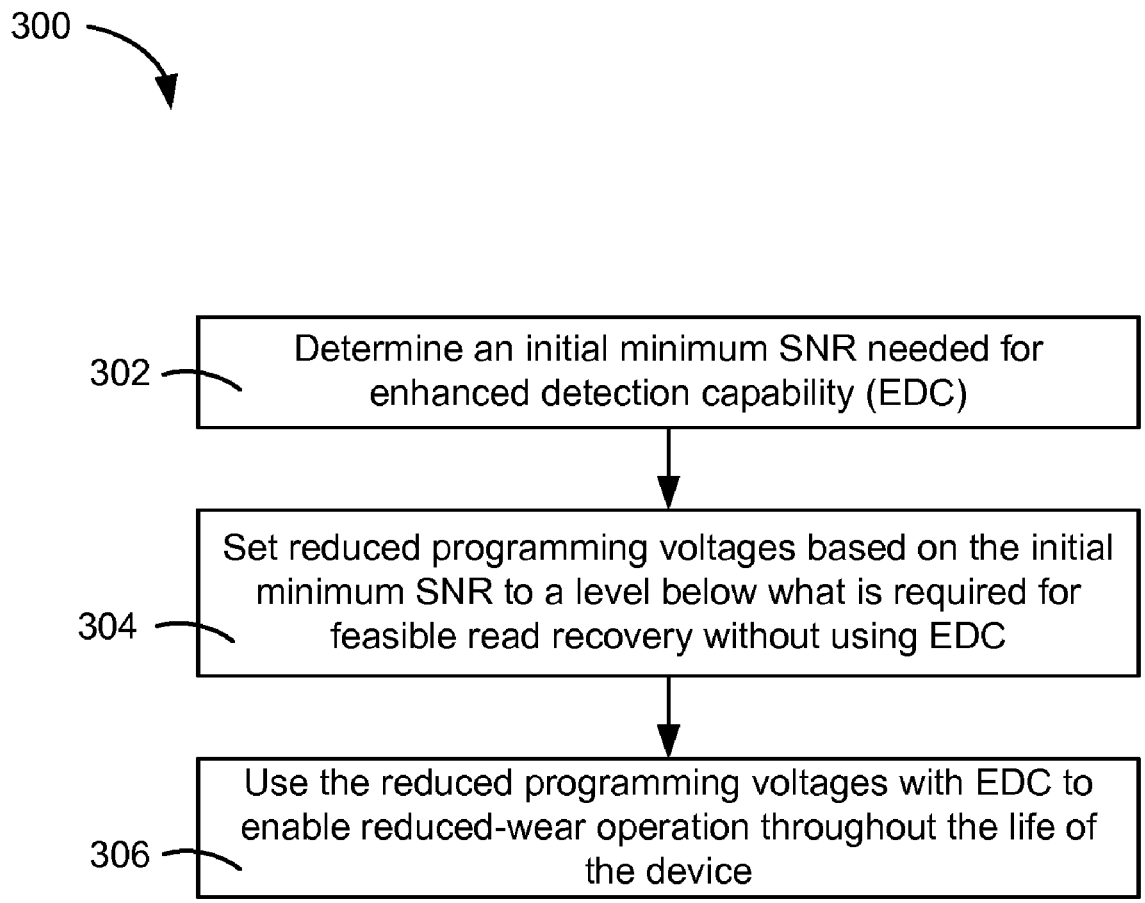
FIG. 3 is a flow diagram of an illustrative embodiment of a method of low wear operation of a memory device.

Referring to FIG. 3, a flow diagram of an illustrative embodiment of a method of low wear operation of a memory device is shown and generally designated 300. The method 300 may include setting an initial minimum SNR needed to recover data using an enhanced detection capability, at 302. Setting the initial minimum SNR may be done in a factory before end use of the memory device or may be done in the field after the memory device has been shipped from the manufacturing facility. Setting the initial minimum SNR may include setting initial programming threshold voltage levels in registers internal to a memory device, such as memory arrays 204 and 206 shown in FIG. 2 or within the array of data storage cells 112 shown in FIG. 1.

The method 300 may also include setting reduced programming threshold voltages based on the initial minimum SNR to a level below what is required for feasible read recovery without using any enhanced detection capabilities, at 304. Setting the reduced programming threshold voltage levels may also be done by setting registers internal to a memory device, such as memory arrays 204 and 206 shown in FIG. 2 or within the array of data storage cells 112 shown in FIG. 1. In some embodiments, the same registers may be set internal to the memory device; thus, setting the reduced programming threshold voltage levels may erase the initial programming threshold voltage levels. In addition, programming current pulse widths, a number of programming current pulses, and/or erase current time may also be reduced based on the reduced programming threshold voltages. The reduced programming threshold voltages may then be used in conjunction with the enhanced detection capability to enable reduced-wear operation throughout the life of the memory device, at 306.

In another particular embodiment, the programming threshold voltages may not be reduced and the initial programming threshold voltages may be used, but the enhanced detection capability may still be implemented to prolong the useful life of a memory device.

Figure 4:
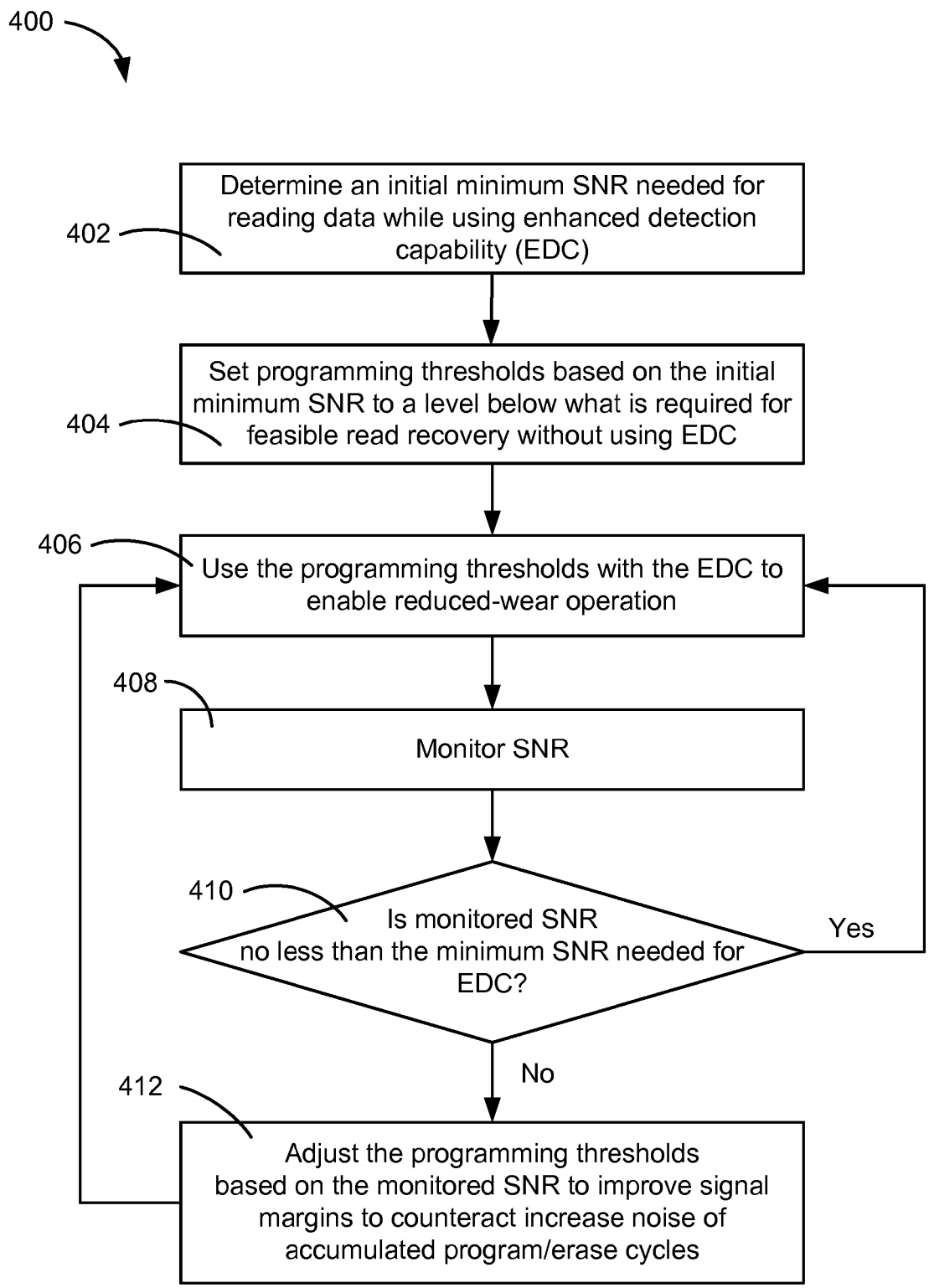
FIG. 4 is a flow diagram of another illustrative embodiment of a method of low wear operation of a memory device.

Referring to FIG. 4, a flow diagram of another illustrative embodiment of a method of low wear operation of a memory device is shown and generally designated 400. The method 400 may include determining an initial minimum SNR needed to read data while using an enhanced detection capability, at 402. The initial minimum SNR may be determined based on the error correcting capabilities of advanced error detection techniques as discussed herein. The initial minimum SNR may be chosen such that a largest number of errors that can be corrected are allowed while providing a small probability of failure on a read, such as a one in one million chance of failure.

The method 400 may also include setting reduced programming threshold voltages based on the initial minimum SNR to a level below what is required for feasible read recovery without using any enhanced detection capabilities, at 404. This may include setting programming threshold voltages within a memory device, such as the memory arrays 204 and 206 shown in FIG. 2, dynamically in the field or prior to shipment of a data storage device from a manufacturer. In addition, the method may also reduce programming voltage, programming current pulse widths, a number of programming current pulses, and erase current time based on the reduced programming threshold voltages. The current pulse widths, number of programming current pulses, and erase current time may also be changed via register settings within the memory device.

The memory device with reduced programming threshold voltages may then be used in conjunction with the enhanced detection capability to enable reduced-wear operation of the memory device, at 406. In a particular embodiment, the reduced wear operation may be implemented throughout the life of the memory device. In another embodiment, the reduced wear operation may be implemented selectively during use of the memory device while a controller dynamically changes the settings of registers in the memory device to reduce the charge transfer and the programming threshold voltages.

During operation of the memory device, the SNR of the programming voltages may be monitored, at 408, and compared to a target SNR to determine if the monitored SNR is no less than a minimum SNR that may be necessary to recover data while using the enhanced error detection capability, at 410. The minimum SNR that may be necessary to recover data while using the enhanced error detection capability may include a range of the SNR above an actual minimum. When the monitored SNR is not less than the minimum SNR needed, the previous programming thresholds may continued to be used, at 406.

When the monitored SNR is less than the minimum SNR needed, the programming thresholds may be adjusted based on the monitored SNR to keep the SNR at the minimum SNR, at 412. The minimum SNR may be determined based on the error correcting capabilities of advanced error detection techniques as discussed herein. The minimum SNR may be chosen such that a largest number of errors that can be corrected are allowed while providing a small probability of failure on a read, such as a one in one million chance of failure. The SNR may be monitored by monitoring the number of errors per read.

Adjusting the programming thresholds can improve signal margins to counteract an increase in noise due to accumulated P/E cycles. Once the programming thresholds have been adjusted, the new programming thresholds may be used to enable the reduce-wear operation, at 406. In addition, adjusting the programming thresholds can reduce charge leakage of the memory cells, reducing an amount of threshold voltage shift that can result in errors.

Figure 5:
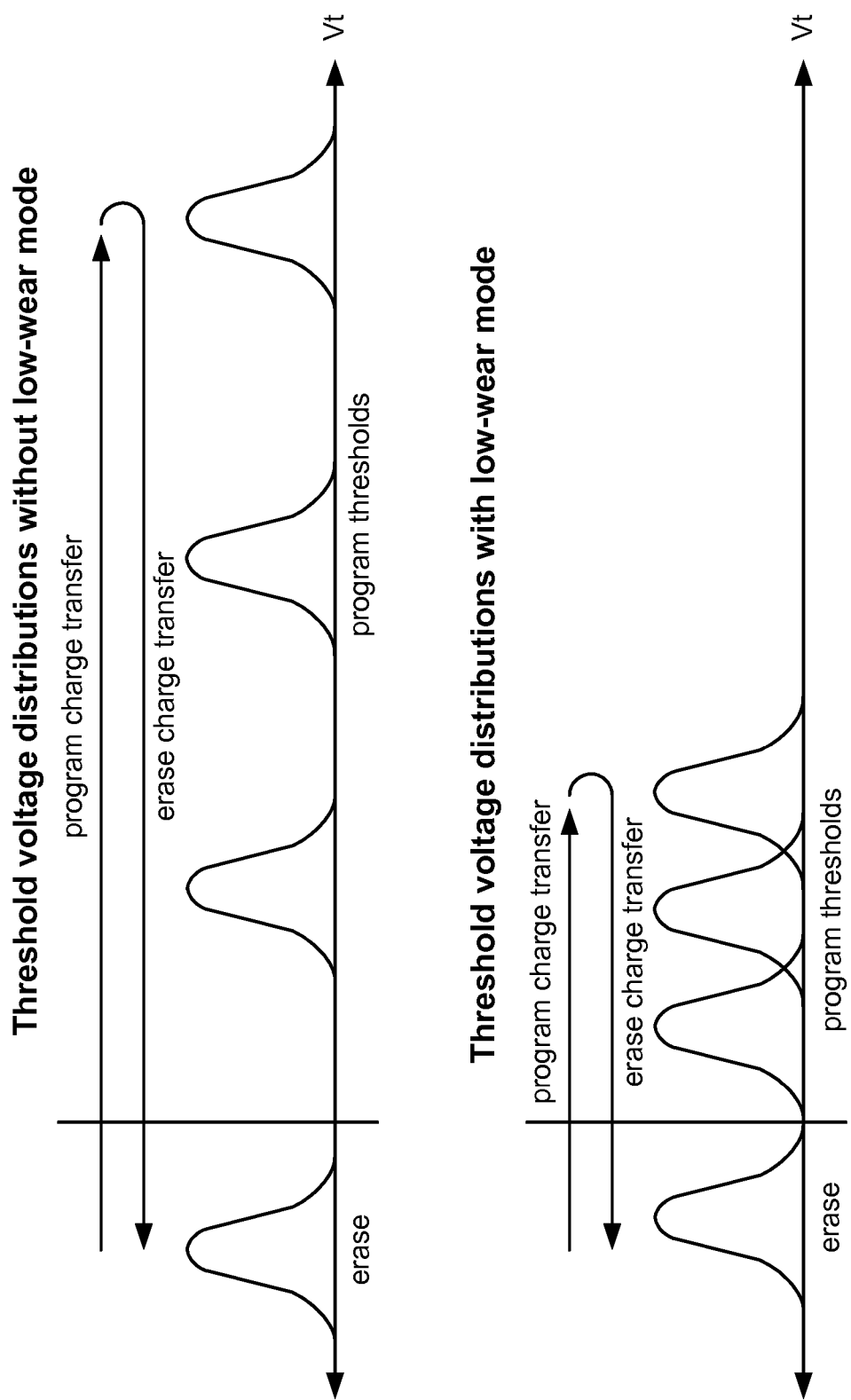
FIG. 5 is a chart representing threshold voltage distributions.

Referring to FIG. 5, a chart representing threshold distributions is shown. The chart shows the range of threshold voltage distributions for use without a low-wear mode and the range of threshold voltage distributions for use with a low-wear mode or constant SNR mode as described herein. In a particular embodiment, the chart may represent a Flash memory device having 2-bits per cell and 4 corresponding threshold voltages.

The program charge transfer and the erase charge transfer represent the tunneling current needed for programming and erasing the memory cells. For example, in Flash memory, the tunneling current is the current driving through the oxide layer that causes the eventual breakdown of the insulator. By grouping the program threshold voltages closer together, less tunneling current will be needed to program the cells and the insulator will not break down as quickly. Thus, reduced wear can be attributed to a reduction in charge transfer, which, for example, may be achieved by reducing the programming current, using lower programming voltage, shorter programming current pulses, or using fewer programming current pulses.

Figure 6:
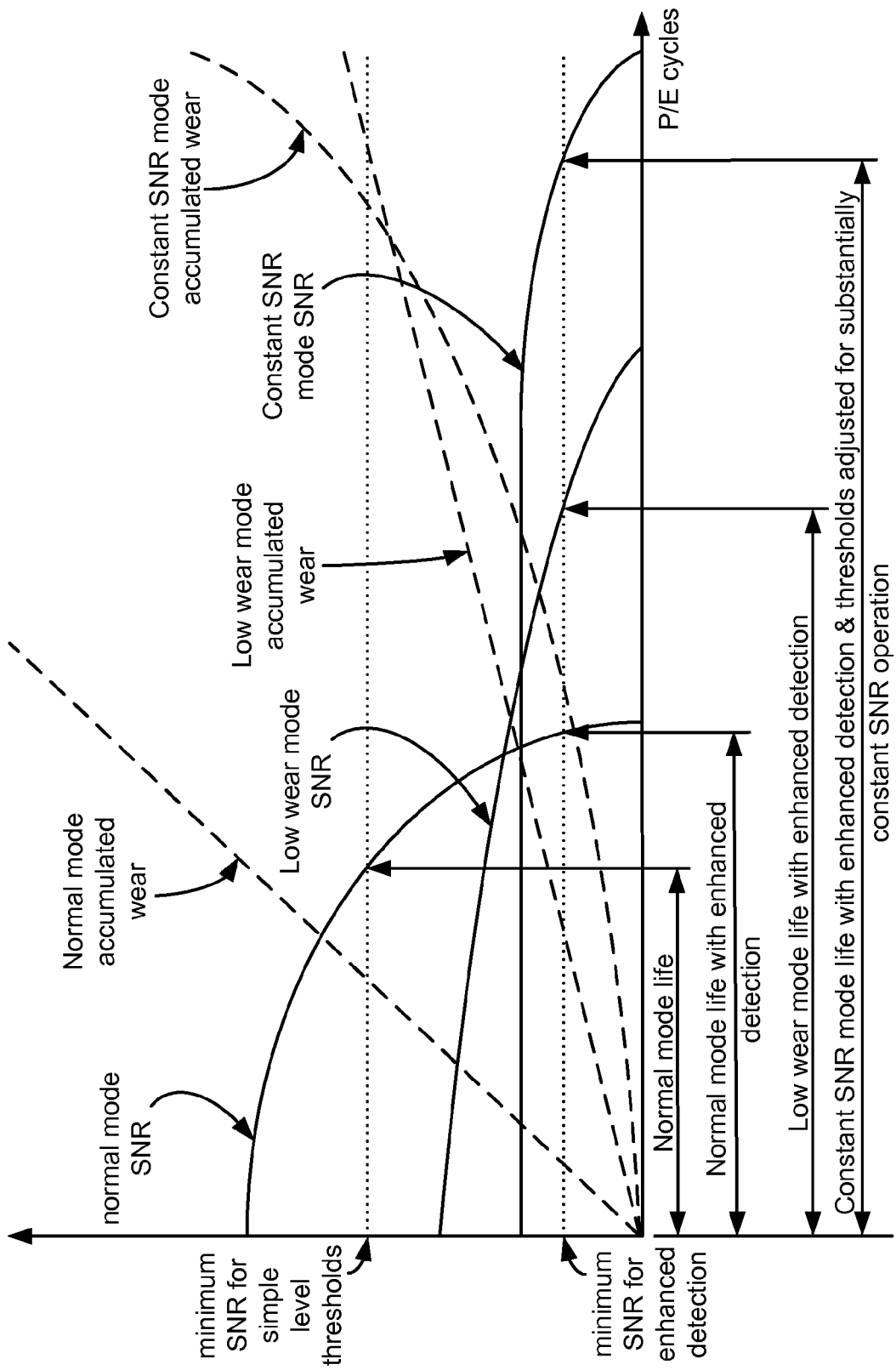
FIG. 6 is a chart representing degradation of signal-to-noise ratio as wear accumulates.

Referring to FIG. 6, a chart representing degradation of signal-to-noise ratio as wear accumulates is shown. The chart shows the relationship between accumulated wear of P/E cycles on a memory device and the SNR of the memory device. The dashed lines represent wear that accumulates with P/E cycles. The slope of the line is proportional to wear per cycle. The solid lines represent the degradation in SNR as the device wear accumulates. Also shown are predicted life expectancies of the different modes of operation discussed herein. When the SNR falls below the respective SNR thresholds, as represented by the dotted lines, the memory device may be at the end of its useful life. As can be seen in FIG. 6, the enhanced detection and low wear modes can operate to extend the useful life of a memory device.

It is to be understood that even though numerous characteristics and advantages of various embodiments have been set forth in the foregoing description, together with details of the structure and function of the various embodiments, this disclosure is illustrative only, and changes may be made in detail, especially in matters of structure and arrangement of parts. For example, the embodiments described herein can be implemented for any type of data storage device that uses programming thresholds, such as Flash memory. Further, the methods describe herein may be implemented by a computer processor, controller, or a hardware control circuit. Also, the particular elements may vary depending on the particular application for the data storage system while maintaining substantially the same functionality without departing from the scope and spirit of the present disclosure. In addition, although an embodiment described herein is directed to a hybrid data storage system including a disc data storage medium and at least one solid-state data storage medium and having a distributed media cache, it will be appreciated by those skilled in the art that the teachings of the present application can be applied to any type of data storage device that may benefit from the ideas, structure, or functionality disclosed herein.

What is claimed is:

1. A memory device comprising:
an array of data storage cells;
a control circuit connected to the array of data storage cells, wherein the data storage cells can be electrically programmed and erased by applying a first programming voltage and programming pulse sequence to achieve a first charge transfer and a first threshold voltage having a first signal-to-noise ratio, the control circuit adapted to:
program the data storage cells by applying a second programming voltage and programming pulse sequence to achieve a second charge transfer that is less than the first charge transfer and a second threshold voltage that is less than the first threshold voltage, the second threshold voltage providing a second signal-to-noise ratio that is lower than the first signal-to-noise ratio.

2. The device of claim 1, wherein the control circuit is adapted to apply the second programming voltage and programming pulse sequence during continuous, normal operation of the memory device.

3. The device of claim 1, further comprising a memory coupled to the control circuit, the memory comprising a register to store an indicator of an amount of voltage to apply to the data storage cells, and the control circuit configured to check the value stored in the register to determine when to implement the second programming voltage.

4. The device of claim 3, wherein the memory further comprises a second register to store a value indicative of a programming current pulse width and a third register to store a value indicative of an erase current time.

5. The device of claim 1, wherein the memory further comprises a fourth register to store a value indicative of a number of programming current pulses to be applied and the control circuit configured to reduce the number of programming current pulses applied for the second voltage compared to a number of programming current pulses applied during the first current.

6. The device of claim 1, further comprising a first detection capability to recover data from a data storage cell containing a first voltage that is greater than the first threshold voltage and a second detection capability to recover data from a data storage cell containing a second voltage that is less than the first threshold voltage.

7. The device of claim 6, wherein the second voltage is below a voltage amount for what is required for feasible read recovery without using the second detection capability.

8. The device of claim 7, wherein the control circuit is adapted to:
determine a minimum signal-to-noise ratio needed to read data while using the second detection capability;
set the second voltage based on the minimum signal-to-noise ratio;
monitor a signal-to-noise ratio of the data storage cells with relation to program and erase cycles; and
adjust the second voltage when the signal-to-noise ratio is lower than the minimum signal-to-noise ratio.

9. The device of claim 8, wherein the second voltage is continually monitored and adjusted to keep the signal-to-noise ratio within a specified range above the minimum signal-to-noise ratio.

10. A method comprising:
providing a memory having data storage cells, wherein the data storage cells can be electrically programmed and erased by applying a programming voltage and programming sequence to induce a charge transfer that changes a first threshold voltage, wherein when programmed and subsequently read, the data storage cells with the first threshold voltage programmed produce a first signal-to-noise ratio;
programming and erasing the data storage cells by applying a second programming voltage and programming sequence to achieve a second threshold voltage that is less than the first threshold voltage, which produces a second signal-to-noise ratio that is lower than the first signal-to-noise ratio; and
retrieving data stored in the data storage cells using a second detection capability that is greater than a first detection capability, the second detection capability adapted to recover data stored using the second threshold voltage, wherein the first detection capability is not capable of recovering data stored using the second threshold voltage.

11. The method of claim 10, wherein the second threshold voltage is an amount below what is required for feasible read recovery without using the second detection capability.

12. The method of claim 11, further comprising applying the second programming voltage and programming sequence during continuous, normal operation of the memory.

13. The method of claim 12, further comprising:
determining a minimum signal-to-noise ratio needed to read data while using the first detection capability;
setting the second threshold voltage based on the minimum signal-to-noise ratio;
monitoring the second threshold voltage; and
adjusting the second threshold voltage to keep the signal-to-noise ratio within a specified range above the minimum signal-to-noise ratio.

14. The method of claim 13, further comprising determining signal-to-noise ratio based on a number of errors per read.

15. A data storage device comprising:
a memory having a control circuit and electrically programmable and erasable data storage cells having programming thresholds for programming the data storage cells; and
a controller coupled to the memory and adapted to dynamically adjust the programming thresholds over the course of usage of the data storage device such that a signal-to-noise ratio from reading data stored in the data storage cells is no less than a minimum amount needed to recover the data using an error detection capability.

16. The data storage device of claim 15, further comprising:
the data storage cells adapted to be programmed and erased by applying a first programming voltage and pulse sequence to achieve a threshold voltage;
the controller adapted to:
program and erase the data storage cells by applying a second programming voltage and pulse sequence to achieve a second threshold voltage that is less than the first threshold voltage, the second threshold voltage providing a signal-to-noise ratio that is lower than a first signal-to-noise ratio that would be caused by applying the first threshold voltage; and
retrieve the data stored in the data storage cells using the error detection capability.

17. The data storage device of claim 16, wherein the second threshold voltage is an amount below what is required for feasible read recovery without using the error detection capability.

18. The data storage device of claim 17, further comprising a first detection capability to recover data from a data storage cell programmed with a threshold voltage greater than the second threshold voltage and a second detection capability to recover data from a data storage cell containing a voltage less than the first threshold voltage.

19. The data storage device of claim 16, wherein the controller is adapted to:
determine a minimum signal-to-noise ratio needed to read data while using the enhanced detection capability;
set the second threshold voltage based on the minimum signal-to-noise ratio;
monitor a signal-to-noise ratio of the data storage cells with relation to program and erase cycles; and
adjust the second threshold voltage based on the signal-to-noise ratio and the minimum signal-to-noise ratio.

20. The data storage device of claim 19, wherein the second threshold voltage is continually monitored and adjusted to keep the signal-to-noise ratio within a specified range above the minimum signal-to-noise ratio.

21. The data storage device of claim 20, wherein the signal-to-noise ratio is determined by monitoring a distribution of errors when reading data from the data storage cells and the minimum signal-to-noise ratio represents a maximum amount of errors that can be corrected per read.

22. The data storage device of claim 15, wherein the memory comprises multi-level cell (MLC) NAND non-volatile memory.

* * * * *